(12) United States Patent
Anazawa

(10) Patent No.: US 9,059,668 B2
(45) Date of Patent: Jun. 16, 2015

(54) SWITCHING MODE AMPLIFIER OPERATION

(75) Inventor: Isao Ginn Anazawa, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 341 days.

(21) Appl. No.: 13/592,636

(22) Filed: Aug. 23, 2012

(65) Prior Publication Data

US 2014/0056442 A1    Feb. 27, 2014

(51) Int. Cl.
*H03F 3/217* (2006.01)

(52) U.S. Cl.
CPC ........ *H03F 3/2173* (2013.01); *H03F 2200/351* (2013.01); *H03F 3/217* (2013.01)

(58) Field of Classification Search
CPC ..... H03F 3/217; H03F 3/2173; H03F 3/2171; H03F 3/00; H03F 2200/351
USPC ............ 381/120, 123, 28; 330/251, 255, 297, 330/207 A, 10
See application file for complete search history.

(56) References Cited

U.S. PATENT DOCUMENTS

| | | | |
|---|---|---|---|
| 4,894,621 A * | 1/1990 | Koenig et al. | 330/251 |
| 5,767,756 A * | 6/1998 | Hwang | 333/124 |
| 5,960,898 A | 10/1999 | Okada et al. | |
| 6,169,681 B1 | 1/2001 | Kemp et al. | |
| 7,215,272 B2 | 5/2007 | Lee | |
| 8,049,561 B2 * | 11/2011 | Buter et al. | 330/251 |
| 8,126,158 B2 * | 2/2012 | Correia et al. | 381/93 |
| 2004/0189502 A1 | 9/2004 | Lee | |
| 2004/0223545 A1 | 11/2004 | Lee | |
| 2010/0054325 A1 | 3/2010 | Sjostrom | |
| 2010/0231298 A1 | 9/2010 | Norimatsu et al. | |
| 2013/0223651 A1* | 8/2013 | Hoyerby | 381/120 |

FOREIGN PATENT DOCUMENTS

WO    2012055968    5/2012

OTHER PUBLICATIONS

Extended European Search Report dated Feb. 5, 2013 for European patent application No. 12181598.9.

* cited by examiner

*Primary Examiner* — Vivian Chin
*Assistant Examiner* — Jason R Kurr
(74) *Attorney, Agent, or Firm* — Jeffrey N. Giunta; Fleit Gibbons Gutman Bongini & Bianco P.L.

(57) ABSTRACT

A switching mode amplifier and method. A voltage divider comprising two series connected reactive components produces, on a center line, a fraction of a voltage received on a first line and a second line. The switching structure produce a fraction of the power supply voltage to the first port or the second port by either one of 1) a first configuration that connects the first port to the first input and the second port to the center line, or 2) a second configuration that connects the first port to the center line and the second port to the second input. A controller responds to a sequence of commands to provide the fraction of the voltage by alternating the switching structure between the first configuration and the second configuration.

15 Claims, 7 Drawing Sheets

| SWITCH CONFIGURATION | VOLTAGE ACROSS LOAD Z | SWITCH COUPLINGS |
|---|---|---|
| FIRST CONFIGURATION | +1/2V | FIRST SWITCH S1 -> +V<br>SECOND SWITCH S2 -> CENTER POINT |
| SECOND CONFIGURATION | +1/2V | FIRST SWITCH S1 -> CENTER POINT<br>SECOND SWITCH S2 -> -V |
| THIRD CONFIGURATION | -1/2V | FIRST SWITCH S1 -> CENTER POINT<br>SECOND SWITCH S2 -> +V |
| FOURTH CONFIGURATION | -1/2V | FIRST SWITCH S1 -> -V<br>SECOND SWITCH S2 -> CENTER POINT |
| FIFTH CONFIGURATION | 0V | FIRST SWITCH S1 -> +V<br>SECOND SWITCH S2 -> +V |
| SIXTH CONFIGURATION | 0V | FIRST SWITCH S1 -> CENTER POINT<br>SECOND SWITCH S2 -> CENTER POINT |
| SEVENTH CONFIGURATION | 0V | FIRST SWITCH S1 -> -V<br>SECOND SWITCH S2 -> -V |
| EIGHTH CONFIGURATION? | +V | FIRST SWITCH S1 -> +V<br>SECOND SWITCH S2 -> -V |
| NINTH CONFIGURATION | -V | FIRST SWITCH S1 -> -V<br>SECOND SWITCH S2 -> +V |

SWITCHING MODE AMPLIFIER OPERATION

FIELD OF THE DISCLOSURE

The present disclosure generally relates to switching mode signal amplifiers, and more particularly to efficient operation of multiple output level switching mode power amplifiers.

BACKGROUND

Switching mode amplifiers, which are sometimes referred to as "Class-D" amplifiers, are incorporated as signal amplifiers in many applications, particularly in applications that value efficient electrical power utilization. Applications incorporating switching mode amplifiers include loudspeaker amplifiers, ultrasonic transducer drivers, motor speed controllers, LED brightness controllers, and many other amplifying or output voltage controlling applications. Switching mode amplifiers operate by rapidly switching an output element, such as a transistor, between a conducting and non-conducting state to create a pulsed output waveform. The output element is usually switched with a frequency that is much greater than the highest frequency component of the signal being amplified or produced. The duration for which the output element is configured to conduct relative to the duration for which the output element is configured to not conduct controls a short term average for the voltage delivered to a load by the amplifier. Low pass filtering to remove the on-off switching components is used to produce the desired, lower frequency signal represented by the pulse width durations. In one example, the load incorporates reactive components, including energy storage devices such as inductors, capacitors, or any other electrical structures, to perform a voltage averaging function and implement this low frequency filtering to allow the load to operate with only the short term average of output voltage. The on/off characteristic of switching mode amplifiers generally result in high power efficiency, particularly when compared to amplifiers with active components that amplify signals using a linear operating mode.

The present description describes circuits that include one or more reactive components. It is clear that the described reactive components are able to be strictly reactive, substantially reactive, or exhibits impedance with a substantial reactive component. In an example of an inductor, most real inductors have a reactive component along with a resistive component, where the resistive component may be negligible or small. A component is able to be characterized as substantially reactive if it has a reactive component, i.e., an imaginary inductive component, that results in a phase shift of time varying electrical current flowing though the device as a function of time varying voltage across the device. Such a component introduces a phase shift between voltage and electrical current applied to the device without regard to the resistance of the device. Components with impedance values including imaginary numbers are considered to be substantially reactive without regard to the value of the impedance value's real number component.

Although switching mode amplifiers are generally highly efficient in converting supply power into the desired output signal, the efficiency of switching mode amplifiers has been noted to decrease as the output power of the output signal is reduced. When producing an output signal at a small fraction of the total output power capacity of a switching mode amplifier, very short duration output pulses are generated and the amount of power consumed by the amplifier that is delivered to an output load decreases.

Therefore, the efficiency and performance of switching mode amplifiers are limited by inefficient energy conversion from power supply to output signal when the amplifiers are operated over a large dynamic range.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 4 illustrates a switch configuration table, according to one example;

DETAILED DESCRIPTION

Figure 1:
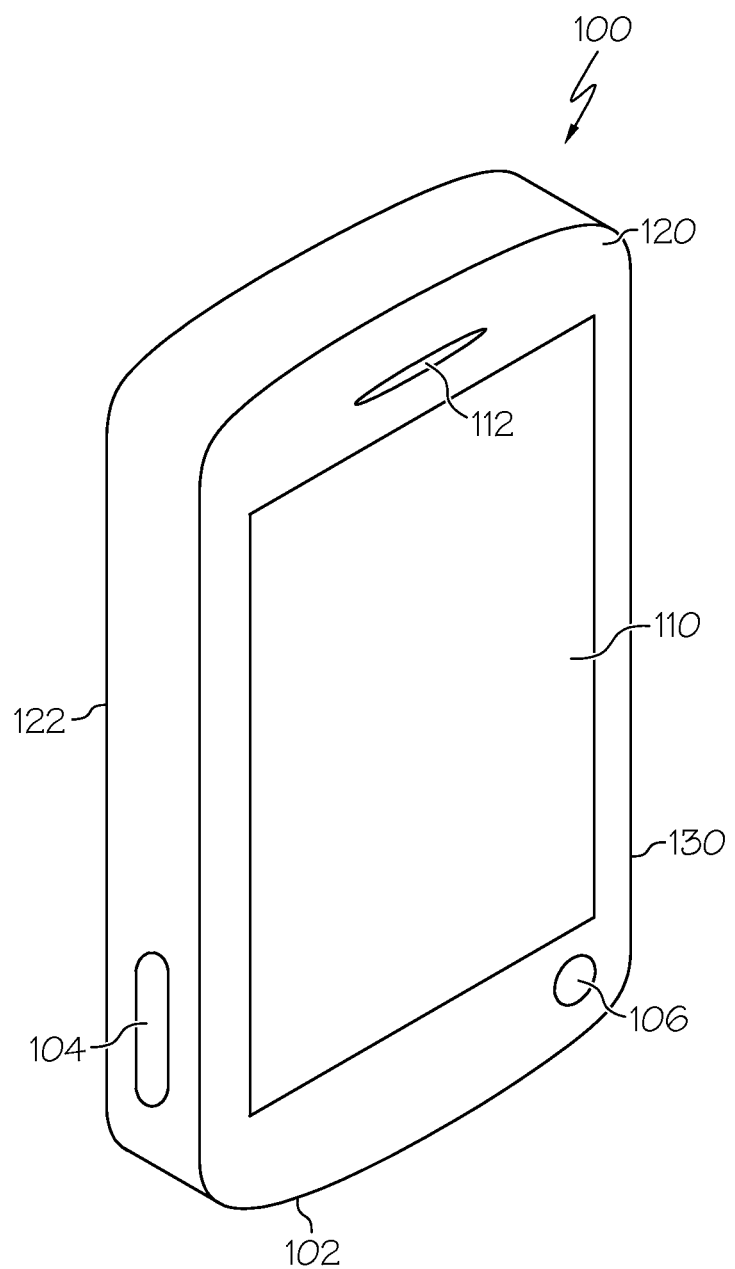
FIG. 1 illustrates a handheld audio device, according to an example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. In the following discussion, "handheld" is used to describe items, such as "handheld devices," that are sized, shaped, designed or otherwise configured to be carried and operated while being held in a human hand.

Described below are switching mode amplifiers and methods of operating same that provide, for example, high efficiency and low spurious signal content output across a large dynamic range, allow switching among multiple output voltages while receiving electrical power from a single voltage power supply, and are able to accommodate manufacturing variations in reactive component values. In one example, a switching mode amplifier described below receives electrical power from a single voltage power supply, such as from a battery or other type power pack, and internally generates at least one intermediate voltage by the use of a voltage divider. This intermediate voltage is generated by a reactive voltage divider in one example that consists of series connected set of reactive components, such as series connected pair of capacitors. In an additional example, a reactive voltage divider is able to be realized as a series connected set of two or more inductors with an intermediate voltage provided at a connection between one of the inductors in the set of indictors and another circuit element. In further examples, any type of voltage reduction element is able to be incorporated into the switching mode amplifier, such as resistive voltage dividers, bucking voltage reducing regulators, or any type of voltage reduction elements. It is further clear that multiple intermediate voltages are able be produced by a voltage divider with multiple elements, such as multiple capacitors, inductors, resistors, other passive or active circuit elements, or any combinations of these, where each of the multiple intermediate voltages are available at junctions between these elements.

The description of the illustrated example refers to components that are connected in series. In the present description, two or more components in series includes, but is not necessarily limited to, two components that are strictly in series, in which all of the current passing through one component also passes through the other component or components. It is clear that a reference to two or more components being connected in series further includes a case of two or more components that are connected substantially in series. Components may be in a substantially series configuration if they behave substantially as if they were strictly in series, with all or nearly all of the current that passes through one component passing through the other. With reference to the above described example, two or more reactive components that are in a substantially serial arrangement are able to also have other components coupled in series with those two reactive components, such as resistive components, other reactive components, active components, or combinations of two or more of these types of components. Similarly, components that are described as being connected in parallel are also able to be arranged in a substantially parallel configuration. In a substantially parallel configuration, components behave substantially as if they were strictly in parallel. In one example of a substantially parallel configuration, two components that each have a first electrical terminal and a second electrical terminal have an electrical coupling between the first terminal of each component, and another electrical coupling between the second electrical terminal of each component. The one or both of the electrical couplings between the two components are able to be either direct couplings or indirect couplings. An indirect connection is able to include, as an example, a connection that include resistive components, reactive components, active components, or combinations of two or more of these types of components.

A switching arrangement allows the selectably coupling of each port of a two port load to any of the two power supply lines or to the intermediate voltage. In the following description, a switching structure is able to selectably couple a particular circuit point, such as a port, to one or more other circuits points by being able to connect the particular point to any of the one or more other circuit points. In various examples, the switching structure selectably couples the particular point to one of the other circuit points in response to a control, signal, command, or similar input. By selectably coupling each port of a two port load to one of three lines, where each line is at a different voltage potential, the switching mode amplifier output is able to be configured to deliver any of five voltage levels across a two port load. Switching among five voltage levels allows better matching of the output voltage to the desired amplified signal level output, thereby increasing the duty cycle of a pulse modulated output to decrease spurious signal content and increase the efficiency of converting power supply energy to output energy over a wide dynamic range.

A switching mode amplifier of one example described below uses a voltage divider that includes two series capacitors to generate an intermediate voltage that is a fraction of the voltage received from the single voltage power supply. In that example, the switching mode amplifier delivers electrical current from the voltage divider by alternating between the two capacitors of the voltage divider. As described in further detail below, alternating the capacitor through which electrical current is drawn from of a capacitive voltage divider operates to maintain the electrical charge on the center point of the capacitive voltage divider and further operates accommodate variations in the actual capacitance values of each capacitor in the capacitive voltage divider.

Switching mode amplifiers such as in examples described below are particularly well suited for use in small, portable devices that are operated by power packs such as batteries. The below described systems generate two or more voltage levels from a single voltage power supply, such as is efficiently provided by a battery or other power pack, by using a voltage divider that consists of passive elements. The capacitive voltage divider of one example operates efficiently, does not include active components to consume energy or dissipate heat, and generally does not include circuit paths that draw electrical current aside from the current delivered to its load. Such aspects improve the efficiency of converting energy received from the power supply into signal energy delivered to the load of the switching mode amplifier.

The use of passive, capacitive components to generate a second voltage from a single voltage power supply allows realization of a switching mode amplifier that has a small physical size and that dissipates little power, which would be dissipated in the form of wasted heat, in its voltage dividing component and its output voltage switching component. In addition to conserving energy, such as from a limited energy power pack, the low power dissipation by the voltage dividing and voltage switching components further allows for the design of a switching mode amplifier that has a smaller physical size and potentially less weight. A circuit that dissipates lower amounts of waste heat obviates a need for physical design aspects such as larger component spacing, large heat sinks, and other physical size consuming design features that are needed to dissipate larger amounts of waste heat.

Switching mode amplifiers, such as are described in the examples below, that generate lower amounts of waste heat dissipation are able to have lower operating temperatures for components of the switching mode amplifier as well as for other components located near the switching mode amplifier. Such lower operating temperatures are able to result in greater reliability due to less thermal stress, an increase in ambient temperature operating ranges, lower case temperatures that are advantageous with, for example, handheld devices, as well as combinations of these benefits.

The switching mode amplifiers described below are able to be incorporated into any type of device. In one example, the switching mode amplifiers amplify audio signals so as to provide an amplified, higher power signal to properly operate a physical speaker to produce an audio signal. Further applications include driving any type of load such as lights, motors, or any type of load. The below described switching mode amplifiers are able to be incorporated into handheld devices, electronic equipment that is installed into vehicles, facilities, or other locations, larger electronic equipment, or any type of electronic component.

FIG. 1 illustrates a handheld audio device 100, according to an example. The handheld audio device 100 is an example of a portable electronic device that is able to include a switching mode audio amplifier as is described below. The handheld audio device 100 in this example is a wireless voice and data communication device such as a smartphone. The illustrated handheld audio device 100 is one example of an electronic device that is able to include examples of switching mode audio amplifiers that are described herein. Further examples of electronic devices that are able to include switching mode audio amplifiers include cellular telephone handsets, telephone handsets, personal audio systems, portable or stationary audio devices, other audio reproduction devices, loudspeaker systems, and the like.

The handheld audio device 100 includes a handheld body 102 that serves as an enclosure for various components and also includes mounting locations for some components. Illustrated as mounted on outside locations of the handheld body 102 are an earpiece speaker 112, a loudspeaker 104, display screen 110, and a voice microphone 106. Further electronic components are mounted within the handheld body 102 to provide functions whereby the handheld audio device 100 is able to operate as a wireless voice and data communications device and perform other audio and data processing functions. The illustrated locations of these components are only one example of many possible mounting locations on the handheld body 102 for these various components.

The earpiece speaker 112 is located on the handheld body 102 in a position that is likely to coincide with the user's ear when the handheld audio device is held to the user's head. This placement is particularly useful when the handheld audio device is used as a telephone. In general, the earpiece speaker 112 generates acoustic sound at a relatively low level because the earpiece speaker is generally held against a user's ear. Although the earpiece speaker 112 usually generates acoustic signals with a low level, some amount of audio signal power amplification is performed in the handheld audio device 100 to properly drive the earpiece speaker. In one example, this amplification is provided by a switched mode audio amplifier such as is described in detail below.

The illustrated handheld body 102 depicts a view of an aspect of the handheld audio device 100 that shows a front 120 and a left side 122 of the handheld audio device 100. The loudspeaker 104 is located on the left side 122 of the handheld audio device 100 to allow the sound generated by the loudspeaker 104 to be effectively broadcast from the handheld body 102 while not being too close to a user's ear when the handheld body 102 is inadvertently held to his or her ear while the loudspeaker is producing sound. In general, the loudspeaker 104 generates acoustical signals at a higher level than is generated by the earpiece speaker 112. The handheld audio device 100 includes an audio amplifier, such as the switched mode audio amplifier described below, to generate an electrical signal to properly drive the loudspeaker 104 to produce the desired acoustic sound level. In further examples, the loudspeaker 104 is able to be mounted at any location on the handheld body 102. Further, multiple loudspeakers, one or more other sound generating devices, or both are able to be mounted on the handheld body 102 at any location. Further, one or more loudspeakers or sound generating devices are able to be electrically connected to the handheld audio device 100 and located at locations separate from the handheld body 102.

Figure 2:
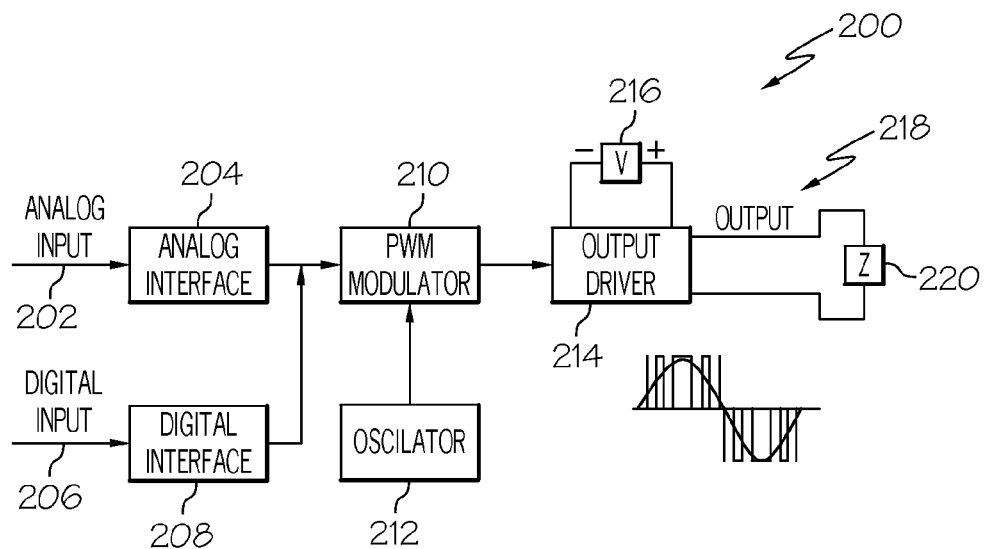
FIG. 2 illustrates an audio amplifier sub-system, according to one example.

FIG. 2 illustrates an audio amplifier sub-system 200, according to one example. The audio amplifier sub-system 200 is an example of an audio amplifier component of the above described handheld audio device 100 that is used to generate higher power audio signals to drive, for example, one or more audio transducers such as one or both of the above described earpiece speaker 112 and the loudspeaker 104. In further examples, the audio amplifier sub-system 200 is an example an audio amplification device that receives an audio signal and produces an electrical or acoustic audio output. In this example, the audio amplifier sub-system 200 includes an output driver 214 that operates in a switched, or Class-D, amplification mode to provide a load, such as load Z 220 that is able to include a sound generating speaker, with a suitable electrical signal to cause the load Z 220 to emit sound in this example.

The illustrated audio amplifier sub-system 200 includes two types of signal interfaces that receive audio signals to be amplified, an analog interface 204, which accepts an analog input 202, and a digital interface 208, which accepts a digital input 206. The analog interface 204 and the digital interface 208 are each examples of an audio input that is able to provide In the illustrated example, both the analog input 202 and the digital input 206 convey information defining sound waves to be amplified for use by components that accept higher level electrical signals, such as a speaker that is represented by the reactive load Z 220. In various examples, only one of these inputs are able to be present in an audio amplifier, or one or more other types of signal inputs are able to be included with or without one or both of these illustrated interfaces.

As is understood by practitioners of ordinary skill in the relevant arts, the analog input 202 generally conveys a signal by means of a varying voltage where the varying voltage represents a signal that is to be amplified in order to drive a speaker to output acoustic energy represented by the input signal. The digital input 206 similarly conveys information representing a signal that is to be amplified in order to drive a speaker to output acoustic energy, but the digital input 206 generally conveys a time sequence of data values that indicate the level of the input audio signal to be amplified and output as acoustic energy. In one example, the digital input 206 is able to convey a sequence of values that correspond to the relative voltage levels in an acoustic input 202 that conveys the same sound information.

The analog interface 204 receives an analog input 202 and conditions the signal received on the analog input in order to properly drive other elements of the audio amplifier subsystem 200. In one example, the analog interface receives an analog signal that has a time varying voltage level that represents an audio signal to be amplified and emitted as acoustical energy. The digital interface 208 receives digital data, as one or more of a serial data sequence, a parallel data interface, or a multiple level data interface. The digital interface 208 in one example further performs clock synchronization for the received digital input 206, either by a separate data clocking signal or by other data clock synchronization techniques.

A Pulse Width Modulation (PWM) modulator 210 receives data from one or both of the analog interface 204 and the digital interface 208. The PWM modulator 210 in one example is a controller that generates output voltage commands to be provided to an output driver 214 based upon the values of the input signals received from either or both of the analog interface 204 and the digital interface 208. The commands generated by the PWM modulator 210 are examples of indications to provide a particular output voltage across the load Z 220. In one example, the PWM modulator 210 generates commands to direct the output driver 214 to output a particular voltage level for a particular time that is selected from one of multiple possible values. The PWM modulator 210 in one example operates according to similar components in audio Class-D switching mode amplifiers, the details of which are familiar to practitioners of ordinary skill in the relevant arts. In one example, the PWM modulator 210 is able to produce indications to provide one of a zero voltage, a fraction of the supply voltage, or the supply voltage across a first port and a second port of a load. In one example, the indication to provide a fraction of the supply voltage and the supply voltage are further able to specify a polarity of that voltage, where the polarity is able to be a first polarity or an opposite polarity that is opposite the first polarity.

In one example, the PWM modulator 210 determines the command to provide to the output driver 214 by comparing the present value of the input signal to one or more high frequency waveforms. The oscillator 212 of one example generate one or more high frequency saw tooth or triangular waveforms to which input signals are compared, in the PWM modulator 210, in order to determine the output voltage to be provided to the load Z 220. In one example, the present value of received input signal is compared to a present value of the one or more high frequency saw tooth or triangular waveform and when the input signal exceeds the value of a high frequency waveform generated by the oscillator 212, the PWM modulator 210 sends a command to the output driver 214 to change the output voltage delivered to the load Z 220 for as long as the received input signal exceeds the present value of the waveform generated by the oscillator 212. In various examples, the PWM modulator 210 is able to be realized with analog circuitry, digital circuitry, or a combination of analog and digital circuitry that perform, for example, the comparison of the input signal to the one or more high frequency waveforms produced by the oscillator 212.

The output driver 214 in one example receives energy from a power supply 216 and provides a time varying output voltage to the load Z 220 through an output 218. In one example, as is described in further detail below, the power supply 216 produces a single output voltage across two power supply lines and the output driver 214 of one example operates to deliver five possible output voltages across the load Z 220 by selectably coupling the load Z 220 across different power supply lines or to an output of a voltage divider, as is described in detail below.

In one example, the output voltages delivered to the load Z 220 changes at an average frequency of the frequency of the high frequency saw tooth or triangular waveforms generated by oscillator 212. As the high frequency saw tooth or triangular waveforms generated by oscillator 212 exceeds or drops below the present value of the input audio signal received by either the analog input 202 or the digital input 206, the output driver 214 changes the output voltage delivered to the load Z 220. The electrical characteristics of the load Z 220 in one example attenuates the high frequency components of the output produced by the output driver 214, and only the lower frequency audio signal that replicates the input signal is passed to some components by the load Z 220, such as an acoustic transducer that responds to the audio signal to produce acoustic signals to be emitted into the surrounding space.

The output load Z 220 in one example is an acoustic signal generator, such as a speaker. In various examples the output load Z 220 is able to be any type of load across which an electrical signal is applied. In various examples, load Z 220 is able to be reactive, resistive, or have any type of impedance to electrical energy flow.

Figure 3:
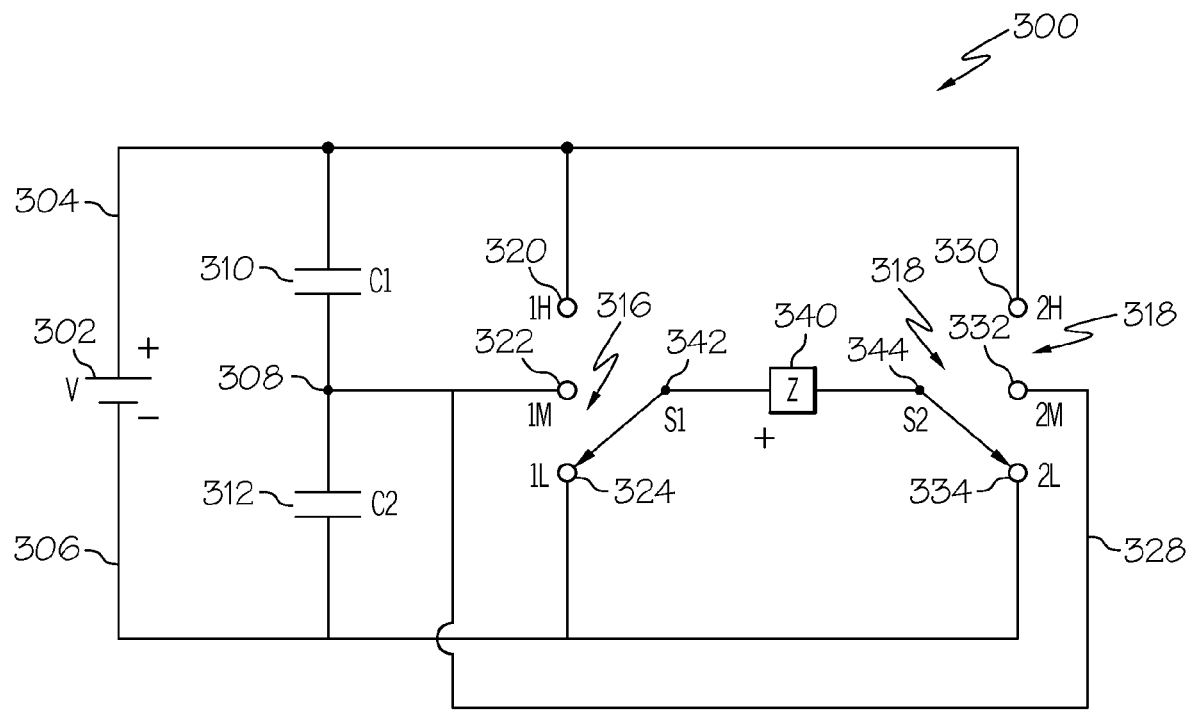
FIG. 3 illustrates a switching mode amplifier output driver, according to one example.

FIG. 3 illustrates a switching mode amplifier output driver 300, according to one example. The switching mode amplifier output driver 300 is an example of an output driver 214 that is used in the audio amplifier sub-system 200, as is described above. The switching mode amplifier output driver 300 receives electrical power from a voltage source 302 and selectably connects each of the two ports of the load Z 340 such that the port is at an electrical potential of one of three possible voltages.

The switching mode amplifier output driver 300 has a direct current (DC) power input from the voltage source 302 that provides a supply voltage across a positive voltage line 304 and a negative voltage line 306. The positive voltage line 304 is an example of a first input and the negative voltage line 306 is an example of a second input. The positive voltage line 304 and the negative voltage line 306 form a power supply input that receives the supply voltage from the voltage source 302. In various examples, the voltage source 302 is able to be part of a device that includes the switching mode amplifier output driver, or the power supply is able to be external to such a device.

The switching mode amplifier output driver 300 of one example has a reactive voltage divider that produces a voltage on a center line 308, where the voltage on the center line 308 is a fraction of the voltage present at the positive voltage line 304 and the negative voltage line 306. In various examples, any type of voltage divider is able to be used, such as a bucking voltage divider, a resistive voltage divider, a voltage divider that includes reactive components in the voltage division circuitry, or any type of voltage reducing processing is able to be used.

In the illustrated example, the voltage reducing processor that produces a voltage between the positive voltage line 304 and the negative voltage line 306 includes reactive components arranged in a voltage dividing arrangement. The switching mode amplifier output driver 300 has a voltage divider that consists of two capacitors that are connected in series between the positive voltage line 304 and the negative voltage line 306. A first capacitor 310 connects the positive voltage line 304 and a center line 308, and a second capacitor 312 connects the center line 308 to the negative voltage line 306. The first capacitor 310 and the second capacitor 312 operate as a voltage divider such that the voltage present at the center line 308 is between the voltage present at the positive voltage line 304 and the negative voltage line 306. The voltage present at the center line 308 is dependent upon the amount of charge on the plates of each of these two capacitors. In one example, the first capacitor 310 and the second capacitor 312 are specified to have equal values, and the actual values of these capacitors will generally be within the manufacturing tolerances of those components from each other.

The capacitance values of the first capacitor 310 and the second capacitor 312 is selected based upon an amount of current that is to be delivered through those capacitors during operation of the switching mode amplifier. The capacitance values of these capacitors is generally dependent upon the switching frequency of the output driver 214, described above, which is based upon the frequency of the waveforms received from the oscillator 212. As the switching frequency of the output driver increases, the energy to be provided by these capacitors, and therefore the value of the capacitors, decreases.

The voltage source 302 is shown to deliver a single output voltage between the positive voltage line 304 and the negative voltage line 306. In general, one of the output lines from the voltage source 302 is able to be connected to a system ground potential. For example, an electronic device, such as the handheld audio device 100, is able to have a battery, power pack, or other power source that has one output line connected to ground structures within the device. In one example, the negative voltage line 306 is able to be connected to the system ground of an electronic device, and the positive voltage line 304 corresponds to a positive power supply voltage. In general, the connection of one power supply output to a system ground potential does not affect the operation of the switching mode amplifier output driver 300. For example, the load 340 in one example is isolated from the system ground potential.

The switching mode amplifier output driver 300 includes a first switch S1 316 and a second switch S2 318. The first switch S1 316 selectably connects a first port of the load 340 to any one of the positive voltage line 304, the center line 308, and the negative voltage line 306. A second switch S2 318 selectably connects a second port of the load 340 to any one of the positive voltage line 304, the center line 308, and the negative voltage line 306. In this example, the first switch S1 316 and the second switch S2 318 form a switching structure that is configurable to selectably couple the first port and the second port of the load 340 to any of the positive voltage line, the negative voltage line and the center line.

In one example, the first switch S1 316 and the second switch S2 318 are controlled by a PWM modulator, such as the PWM modulator 210 described above. The first switch S1 316 and the second switch S2 318 are able to be realized by any controllable switching design. In one example, each of the first switch S1 316 and the second switch S2 318 includes three semiconductor switching devices, such as Field Effect Transistors (FETs). In various examples, the first switch S1 316 and the second switch S2 318 are able to be realized by circuitry that consists of one or more of any type of FET, such as J-FET, CMOS-FET, SiC-MOS-FET, or bi-polar transistors such as Insulated Gate Bi-Polar transistors (IGBT).

In an example of a switching mode amplifier output driver 300 that includes FETs to implement coupling of the load to a power line, a first FET of the first switch S1 316 couples the first port 342 of the load 340 to the positive voltage line 304 via a first switch positive contact 320. A second FET of the first switch S1 316 couples the first port 342 of the load 340 to the center line 308 via a first switch center line contact 322. A third FET of the first switch S1 316 couples the first port of the load 340 to the negative voltage line 306 via a first switch negative voltage contact 324. Three FETs in the second switch S2 318 similarly couple the second port 344 of the load 340 to: 1) the positive voltage line 304 via a second switch positive contact 330; 2) to the center line 308 via a second switch center line contact 332; and 3) to the negative voltage line 306 via a second switch negative voltage contact 334. In one example, these FETs are controlled by signals from the PWM modulator 210 that are directing a particular coupling based upon, for example, the level of the input signal to be amplified.

As described below, configuration of the first switch S1 316 and the second switch S2 318 allow the voltage across the load 340 to be one of five (5) possible voltages. In the following discussion, the polarity of voltages across the load 340 is described with reference to the first port 342 of the load 340, which is considered to be the "positive" port of the load 340. The polarity of voltages across the load 340 is described according to this orientation in order to clearly describe the operation of the switching mode amplifier output driver 300 in this example. Choosing this polarity orientation is in no way a limitation on the operation of the load 340.

When the first switch S1 316 couples the first port 342 to the first switch positive contact 320, zero volts is able to be placed across the load 340 by configuring the second switch 318 to couple the second port 344 to the second switch positive contact 330. Further, when the first switch S1 316 couples the first port 342 to the first switch positive contact 320, a fraction of the source voltage V, as determined by the relationship between the values of the first capacitor C1 310 and second capacitor C2 312, is able to be placed across the load 340 by configuring the second switch 318 to couple the second port 344 to the second switch center line contact 332. In the following discussion, the fraction of the power supply voltage, indicated as "V," that is present between the positive voltage line 304 and the center line 308 is assumed to be ½ V volts. The power supply voltage V is able to be placed across the load 340 by configuring the second switch 318 to couple the second port 344 to the second switch negative voltage contact 334 while the first switch S1 316 couples the first port 342 to the first switch positive contact 320.

When the first switch S1 316 couples the first port 342 to the first switch center line contact 322, negative one half voltage (−½ V) is able to be placed across the load 340 by configuring the second switch 318 to couple the second port 344 to the second switch positive contact 330, zero volts is able to be placed across the load 340 by configuring the second switch 318 to couple the second port 344 to the second switch center line contact 332, and +½ V volts are able to be placed across the load 340 by configuring the second switch 318 to couple the second port 344 to the second switch negative voltage contact 334.

When the first switch S1 316 couples the first port 342 to the first switch negative voltage contact 324, the output voltage V of the voltage source 302 is placed across the load 340 with a negative polarity, i.e., −V, by configuring the second switch 318 to couple the second port 344 to the second switch positive contact 330. Further, −½ V is able to be placed across the load 340 by configuring the second switch 318 to couple the second port 344 to the second switch center line contact 332, and zero volts are able to be placed across the load 340 by configuring the second switch 318 to couple the second port 344 to the second switch negative voltage contact 334.

The combination of the three possible configurations of the first switch S1 316 and the three possible configurations of the second switch S2 318 produces nine possible states. As indicated by the above described combination of configurations for the first switch S1 316 and the second switch S2 318, more than one switch configuration is able to be chosen to produce the same voltage across the load 340. For example, +½ V is placed across the load by 1) coupling the first port 342 to the first switch positive contact 320 and the second port 344 to the second switch center line contact 332, or by 2) coupling the first port 342 to the first switch center line contact 322 and the second port 344 to the second switch negative voltage contact 334.

The above described switching mode amplifier output driver 300 depicts a reactive voltage divider with two capacitors, the first capacitor 310 and the second capacitor 312, that produce one intermediate voltage. In further examples, additional intermediate voltages are able to be produced by including a voltage divider that consists of a number of capacitors connected in series with one another, where different intermediate voltages are produced at the junction between each of these series connected capacitors. An output switching structure of such examples operates to selectably couple each of the two ports of the load 340 to the positive voltage line, the negative voltage line, or to any junction between two capacitors of a series sequence of multiple capacitors configured as a multiple level voltage divider.

FIG. 4 illustrates a switch configuration table 400, according to one example. The following description of the switch configuration table 400 refers to components depicted in FIG. 3 and described above with regards to the switching mode amplifier output driver 300. The switch configuration table 400 depicts the selectable couplings that are made by the first switch S1 316 and the second switch S2 318 in each of the nine possible configurations of those two switches. The switch configuration table 400 includes a configuration number column 402 that has a heading of "Switch Configuration" and specifies an identifier for each configuration, as is described below. The switch configuration table 400 also includes an output voltage column 404 that indicates the output voltage delivered to the load Z 340. As described above, the voltage delivered to the load Z 340 is able to have a positive polarity or a negative polarity based upon the configuration of the switches. The switch configuration table 400 further includes a switch coupling column 406 that defines the couplings of the first switch S1 316 and the second switch S2 318.

The switch configuration table 400 includes a first row 410 that depicts information for a first configuration. The first configuration delivers a voltage of +½V across the load Z 340. In this first configuration, the first switch S1 316 couples the first port 342 to the first switch positive contact 320, and thereby to the positive voltage line 304. In the first configuration, the second switch S2 318 couples the second port 344 to the second switch center line contact 332, and thereby to the center line 308.

The switch configuration table 400 includes a second row 412 that depicts information for a second configuration. The second configuration also delivers a voltage of +½V across the load Z 340. In this second configuration, the first switch S1 316 couples the first port 342 to the first switch center contact 322, and thereby to the center line 308. In the second configuration, the second switch S2 318 couples the second port 344 to the second switch negative voltage contact 334, and thereby to the negative voltage line 306.

The switch configuration table 400 includes a third row 414 that depicts information for a third configuration. The third configuration delivers a voltage of −½V across the load Z 340. In this third configuration, the first switch S1 316 couples the first port 342 to the first switch center contact 322, and thereby to the center line 308. In the third configuration, the second switch S2 318 couples the second port 344 to the second switch positive voltage contact 330, and thereby to the positive voltage line 304.

The switch configuration table 400 includes a fourth row 416 that depicts information for a fourth configuration. The fourth configuration, in addition to the third configuration, also delivers a voltage of −½V across the load Z 340. In this fourth configuration, the first switch S1 316 couples the first port 342 to the first switch positive contact 320, and thereby to the positive voltage line 304. In the fourth configuration, the second switch S2 318 couples the second port 344 to the second switch center line contact 332, and thereby to the center line 308.

The switch configuration table 400 includes a fifth row 418 that depicts information for a fifth configuration. The fifth configuration delivers a voltage of zero volts (0V) across the load Z 340. In this second configuration, the first switch S1 316 couples the first port 342 to the first switch positive voltage contact 320, and thereby to the positive voltage line 304. In the second configuration, the second switch S2 318 couples the second port 344 to the second switch positive voltage contact 330, and thereby to the positive voltage line 304.

The switch configuration table 400 includes a sixth row 420 that depicts information for a sixth configuration. The sixth configuration, in addition to the fifth configuration described above, also delivers a voltage of 0 V across the load Z 340. In this sixth configuration, the first switch S1 316 couples the first port 342 to the first switch center contact 322, and thereby to the center line 308. In the second configuration, the second switch S2 318 couples the second port 344 to the second switch center contact 332, and thereby also to the center line 308.

The switch configuration table 400 includes a seventh row 422 that depicts information for a seventh configuration. The seventh configuration, in addition to the fifth configuration and the sixth configuration, also delivers a voltage of 0 V across the load Z 340. In this seventh configuration, the first switch S1 316 couples the first port 342 to the first switch negative voltage contact 324, and thereby to the negative voltage line 306. In the seventh configuration, the second switch S2 318 couples the second port 344 to the second switch negative voltage contact 334, and thereby also to the negative voltage line 306.

The switch configuration table 400 includes an eighth row 424 that depicts information for an eighth configuration. The eighth configuration delivers a voltage of +V across the load Z 340. In this second configuration, the first switch S1 316 couples the first port 342 to the first switch positive voltage contact 320, and thereby to the positive voltage line 304. In the eighth configuration, the second switch S2 318 couples the second port 344 to the second switch negative voltage contact 334, and thereby to the negative voltage line 306.

The switch configuration table 400 includes a ninth row 426 that depicts information for a ninth configuration. The ninth configuration delivers a voltage of −V across the load Z 340. In this second configuration, the first switch S1 316 couples the first port 342 to the first switch negative voltage contact 324, and thereby to the negative voltage line 306. In the ninth configuration, the second switch S2 318 couples the second port 344 to the second switch positive voltage contact 330, and thereby to the positive voltage line 304.

Figure 5:
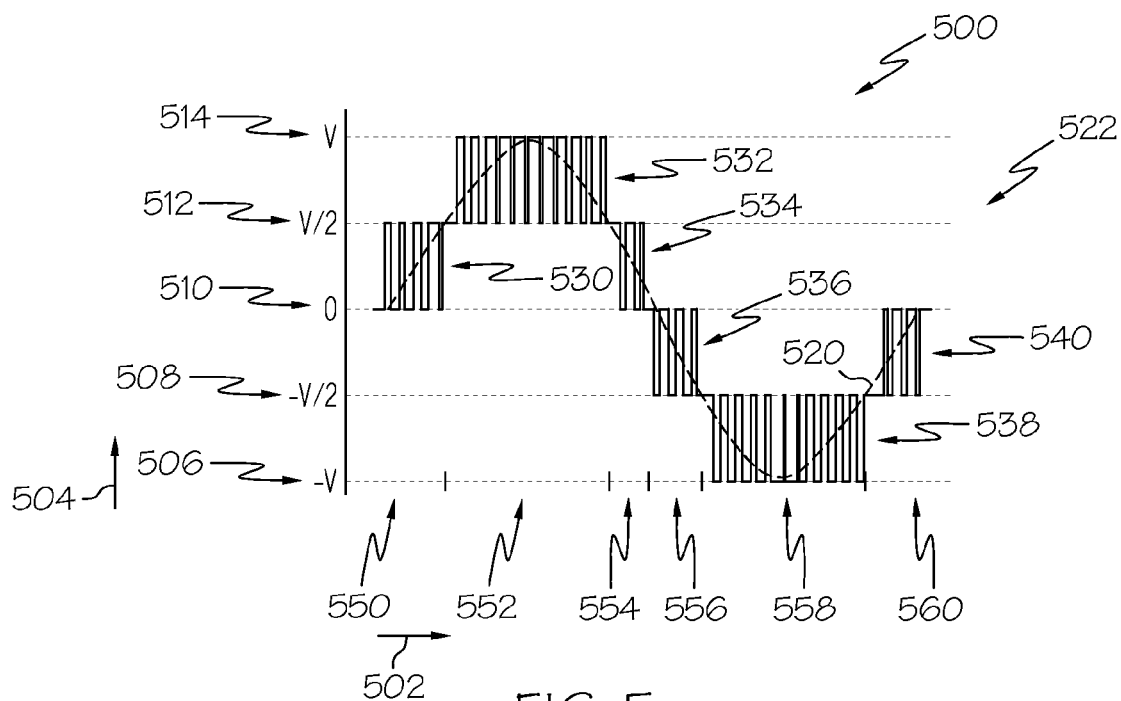
FIG. 5 illustrates a pulse width modulated (PWM) representation of a sinusoidal waveform, according to one example.

FIG. 5 illustrates a pulse width modulated (PWM) representation of a sinusoidal waveform 500, according to one example. The PWM representation of a sinusoidal waveform 500 is an example of an output electrical waveform that is produced by the audio amplifier sub-system 200, i.e., the electrical waveform that is presented to the load Z 220 or load 340 by operation of the first switch S1 316 and the second switch S2 318. The following description of the PWM representation of a sinusoidal waveform 500 refers to components of the audio amplifier sub-system 200 to facilitate the description of the depicted signals and to more clearly explain certain features. The principles presented in this description of the PWM representation of a sinusoidal waveform 500 are representative of the operation and output of switched mode amplifier circuits that incorporate the principals described herein.

The description of the PWM representation of a sinusoidal waveform 500 depicts a sinusoidal waveform 520 that represents a low frequency component of the switched voltages produced by the output driver 214 and the switching mode amplifier output driver 300. The PWM representation of a sinusoidal waveform 500 illustrates a switched output waveform 522 that is produced by alternating switch configurations of the switching mode amplifier output driver 214 among the switch configurations described above in reference to FIG. 4 for the switch configuration table 400.

In general, the output of the output driver 214 is switch at a frequency that is much higher than the highest frequency components of an input waveform received by the audio amplifier sub-system 200. As described above, switches within the switching mode amplifier output driver 300 are configured by a PWM modulator 210 to connect each port of a two port load impedance to one of three lines that are at different voltage levels. As described above, the output driver 300 selectably connects each port to a +V line that is the positive voltage line 304, a −V line that is a negative voltage line 306, and a center line 308 that is at a voltage between the voltage levels of the +V line 304 and the −V line 306. The voltage level of the center line in one example is half way between the voltage levels of the +V line 304 and the −V line 306 and is created by the voltage divider that includes two reactive components such as the first capacitor 310 and the second capacitor 312, as is described above.

The PWM representation of a sinusoidal waveform 500 depicts the voltage levels produced by an output driver 216 in response to a sinusoidal waveform input that is received by an audio amplifier subsystem 200 as is described above with regards to FIG. 2. The input waveform is able to be received at either the analog interface 204 or the digital interface 208. As discussed above, an input to the audio amplifier sub-system 200 or to a similar system is able to be in any type of digital or analog form.

The PWM representation of a sinusoidal waveform 500 depicts a sinusoidal waveform 520 in this example that corresponds to a sinusoidal input waveform. A sinusoidal waveform is depicted to simplify the description of certain aspects of the depicted example, and an input waveform to a switching mode amplifier is able to have any shape or sequence of values. In general, the frequency components of the input waveform are generally limited to a defined bandwidth, such as a bandwidth of audio signals. The depicted sinusoidal waveform 520 reflects the low frequency components of the switched voltage levels produced by the output driver 214. Higher frequency components of the switched voltage levels produced by the output driver 214 are generally filtered out by components of the load Z 220. In one example, the load Z 220 includes a sound transducer, such as a speaker, that responds to the frequency components of input signals that fall within an audible frequency band that corresponds to, for example, human hearing. The sound transducer in one example further does not respond to frequency components that fall outside of, such as that are higher in frequency than, that audible frequency band.

The PWM representation of a sinusoidal waveform 500 depicts a time axis 502 along a horizontal direction and a voltage axis 504 along a vertical direction. The voltage axis 504 depicts five (5) voltage levels, a −V level 506, a −½ V level 508, a zero (0) voltage level 510, a +½ V level 512, and a +V level 514. These output voltage levels correspond to the output voltages as depicted in the switch configuration table 400 described in regards to FIG. 4. In this example, the voltage between the +V level 514 and the −V level 506 is equal to the single ended power supply voltage produced by the power supply 216. As noted in the description of the switch configuration table 400, some voltages, such as zero volts or the +½ V level or −½ V level, are able to be generated by multiple switch configurations.

The time axis 502 is divided into six time intervals, or durations, that are identified based upon the voltage range of the sinusoidal waveform 520 that is produced by the output driver 214. This voltage range corresponds to voltage ranges of the input signal from which the output signal is generated. During a first duration 550, the switching mode amplifier output driver 300 produces a first portion 532 of a switched output waveform 522 by alternatively connecting the two ports of the load 340 between voltage levels that that are either equal, and produces a first portion output 530 that has a net voltage equal to the zero volt level 510 across the load 340, or that differ by positive one half (+½) V and therefore produce a net voltage equal to the +½ V level 512. By varying the ratio of time that zero volts is placed across the load impedance, and that the amount of time that +½V is placed across the load impedance, a short term average voltage is able to be produced that is represented by the sinusoidal waveform 520 in this example. When the input signal, which has a similar shape as the sinusoidal waveform 520, has a value close to zero, the output driver places zero volts across the load 340 for longer time durations than the time durations when +½ V are placed across the load 340. As the input waveform voltage increases to be closer to a value corresponding to an output voltage of the sinusoidal waveform 520 that is closer to +½ V, the output driver places +½ V across the load 340 for longer time durations than the time duration when zero volts are placed across the load 340.

During a second duration 552, the sinusoidal waveform 520 has values between the +½ V level 512 and the +V level 514. In order to produce a second portion 532 of the switched output waveform 522, the switching mode amplifier output driver 300 alternatively connects the two ports of the load 340 between voltage levels that that produce either the +½ V level 512 across the load 340, or that produce the +V level 514 across the load 340. In a manner similar to that described above for the first portion 530 when producing an output in a different output voltage range, when the input signal has a voltage value that corresponds to a sinusoidal waveform 520 value close to +½ V level 512, the output driver places +½ V across the load 340 for longer time durations than the time duration when +V is placed across the load 340. As the input signal is near a value that corresponds to the sinusoidal waveform 520 being closer to +V level 514, the switching mode amplifier output driver 300 places +V across the load 340 for longer time durations than the time duration when +½ V are placed across the load 340.

A third duration 554 of the PWM representation of a sinusoidal waveform 500 is depicted that is similar to the first portion 530 except that the value of the sinusoidal waveform 520 is decreasing during the third portion 534. During the third duration 534, the switching mode amplifier output driver 300 generates a third portion output 554 of the switched output waveform 522 by configuring switches to place either the +½ V level 512 or the zero volt level 510 across the load impedance for durations that produce a low frequency component that corresponds to the sinusoidal waveform 520 during the third duration.

During a fourth duration 556, the input signal has voltage values that result in the sinusoidal waveform 520 having values between the zero volt level 510 and the −½ V level 508. In order to produce a fourth portion output 536, the switching mode amplifier output driver 300 alternatively connects the two ports of the load 340 between the zero volt level 510 or the −½ V level 508. In a manner similar to that described above, when the sinusoidal waveform 520 has a value close to the zero volt level 510, the output driver 214 places zero volts across the load 340 for longer time durations than the time duration when the load impedance has the −½ V level 508 across it. As the sinusoidal waveform 520 is closer to the −½ V level, the switching mode amplifier output driver 300 places the −½ V level 508 across the load 340 for longer time durations than the time duration when the zero volt level 510 is placed across the load 340. The PWM representation of a sinusoidal waveform 500 further depicts a sixth duration 560 that is similar to the fourth duration 556 in that the sixth portion output 540 is created by switching between the −½ V level 508 and the zero level 510, but with the difference that the value of the sinusoidal waveform 520 is increasing during the sixth duration 560.

During a fifth duration 558, the input signal has values that correspond to the sinusoidal waveform 520 having values between the −½ V level 508 and the −V level 506. In order to produce this output waveform, the switching mode amplifier output driver 300 alternatively connects the two ports of the load 340 between voltage levels that that produce either the −½ V level 508 across the load 340, or that produce the −V level 506 across the load 340. In a manner similar to that described above, when the sinusoidal waveform 520 has a value close to the −½ V level 508, the output driver places the −½ V level 508 across the load 340 for longer time durations than the time duration when the −V level 506 is placed across the load 340. As the sinusoidal waveform 520 is closer to the −V level 506, the switching mode amplifier output driver 300 places the −V level 506 across the load 340 for longer time durations than the time durations when the −½ V level 508 is placed across the load 340.

As described above, the switching mode amplifier output driver 300 of one example varies the ratio of time each of the two described voltages is placed across the load 340 in order to create a desired short term average voltage. The short term average voltage, as is contained in a low frequency component signal represented by the sinusoidal waveform 520 in the PWM representation of a sinusoidal waveform 500, is able to be accurately controlled by varying the ratio of time durations that each of the above described voltages are placed across the load 340.

The above described switching mode amplifier output driver 300 is able to place one of five (5) voltages across the load 340. The switching mode amplifier output driver 300 of one example operates to switch between two voltages that are selected based upon the value of the low frequency component signal to be provided to the load impedance. The switching mode amplifier output driver 300 of one example further switches the voltage placed across the load impedance between two voltages values that are closest to each other. In the above described example, the voltage across the output load 340 is switched between two voltages that differ by a magnitude of ½ V.

In contrast to the above described example that switches between voltages that differ by ½ V, further examples are able to generate a particular low frequency component signal at a load impedance by switching between voltages with greater differences. One instance of such a further example generates low frequency components with positive voltages are able to be generated by switching between zero volts and +V. Negative voltages are generated by switching between zero volts and −V. The ratio of time durations that each of those voltages is placed across the load impedance is adjusted so as to cause the desired low frequency component voltage to be delivered to the load impedance. Switching the output voltage by a larger amount, in comparison to the ½ V switching magnitude of the above described example, may result in larger amounts of higher frequency signals that are to be filtered out to produce the desired low frequency component.

Figure 6:
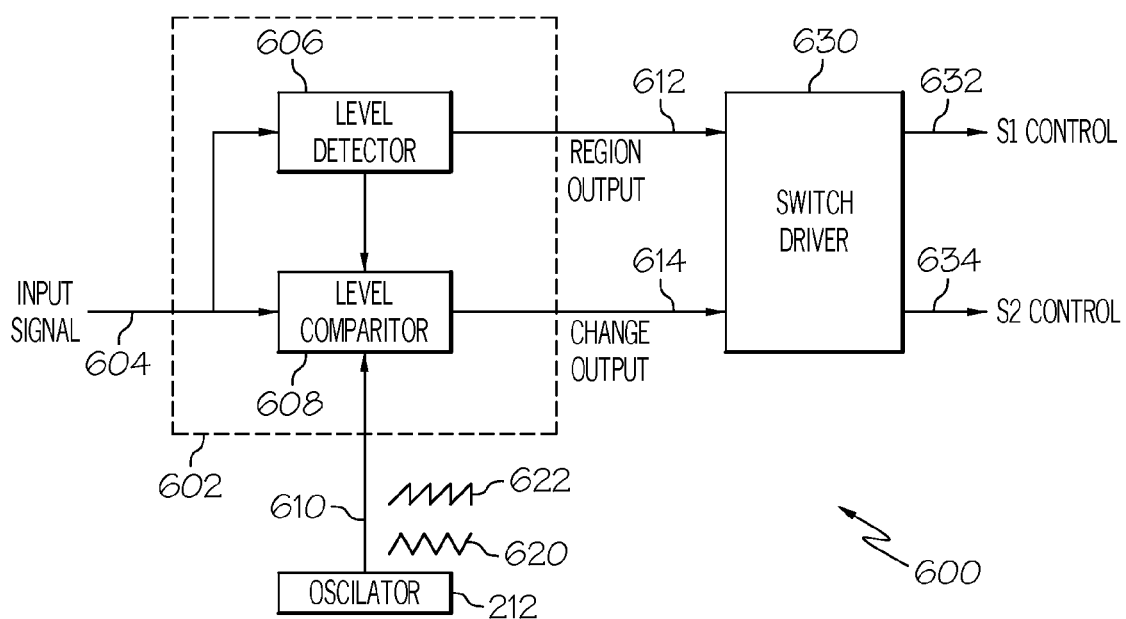
FIG. 6 illustrates a multiple level PWM modulator design, according to one example.

FIG. 6 illustrates a multiple level PWM modulator design 600, according to one example. The multiple level PWM modulator design 600 depicts one design of a PWM modulator 602, and its associated connections, that is able to accept an input signal 604 and configure an output driver of a switching mode amplifier to provide an amplified version of the input signal. As described above, the input signal 604 is able to be in an analog format, a digital format, or any format that delivers input signal information to the PWM modulator 602.

The PWM modulator 602 of this example includes a level detector 606 and a level comparator 608. Referring to the above described examples where the switched output signal is produced by switching between set output voltage levels, the level detector 606 is configured to determine input signal levels that correspond to those set output voltage levels. As described above, valid input signals are specified to have levels between a +full scale value and a −full scale value. In one example, input values that are beyond this range are treated as though they are at the maximum of that range, i.e., input values above the +full scale value are treated as though they are at the +full scale value and input values less than the −full scale value are treated as though they are at the −full scale value.

Using the example illustrated in FIG. 5, the switched output signal is produced by switching between five (5) output voltage levels, the −V level 506, the −½ V level 508, the zero (0) voltage level 510, the +½ V level 512, and the +V level 514. In such an example, the +V level 514 is produced in response to an input signal with a value equal to the +full scale value, and the −V level 506 is produced in response to an input signal with a value equal to the −full scale value. The level detector 606 detects the relationship of the value of the input signal relative to thresholds that result in outputting any of the specified output voltage levels, i.e., the above described five (5) output voltage levels corresponding to the −V level 506, the −½ V level 508, the zero (0) voltage level 510, the +½ V level 512, and the +V level 514.

The level comparator 608 receives a saw tooth waveform 622 or a triangular waveform 620 from an oscillator 212. The saw tooth waveform 622 and the triangular waveform 620 generated by the oscillator 212 are described above. The level comparator 608 in one example determines the value of the input signal 604 within the range between levels detected by the level detector 606. In the above example in which the output driver switches between five levels, four regions of values exist between these five values. With reference to FIG. 5, input signal values that fall between the values that correspond to an output voltage level fall into four regions. In particular, a first input region exists between input values that correspond to outputs between the −V level 506 and the −½ V level 508, a second input region first input region exists between input values that correspond to outputs between the zero (0) voltage level 510 and the −½ V level 508, a third input region exists between input values that correspond to outputs between the zero voltage level 510 and the +½ V level 512, and a fourth input region exists between input values that correspond to outputs between the +½ V level 512 and the +V level 514.

The level comparator 608 determines the timing for switching between two output voltage levels. In one example, the level comparator 608 receives level information from the level detector 606 to, for example, shift the level of the input signal 604 to properly align the input signal within the input region for comparison to the saw tooth or triangular waveform received from the oscillator 212.

The PWM modulator 602 of one example produces a region output 612 and a change output 614. The region output 612 and the change output 614 are examples of commands, or indications, of voltages to provide across a load, such as the load Z 220 described above. The region output defines the region in which the output voltage falls. In one example, these regions are defined by the two voltages between which the output is switched. In the example of the first region, the output voltage is switched between the −V level 506 and the −½ V level 508. The change output 614 is used to determine which of these two output voltages is produced. Stated differently, the change output 614 specifies when to change between the two output voltages that define the region.

The region output 612 and the change output 614 are provided to a switch driver 630. The switch driver 630 receives the region output 612 and the change output 614, which are indications of the voltage to provide across two ports of a load. The switch driver 630 responds to receiving these indications by producing control signals to control switches in an output driver, such as the switched mode amplifier output driver 300. The switch driver 630 produces an S1 control signal 632, which configures the first switch 316 of the switched mode amplifier output driver 300. The switch driver 630 further produces an S2 control signal 634, which configures the second switch 318 of the switched mode amplifier output driver 300. In one example, the switch driver 630 produces the S1 control signal 632 and the S2 control signal 634 in response to receiving the indications of output voltage to provide across the load that is conveyed by the region output 612 and the change output 614.

Figure 7:
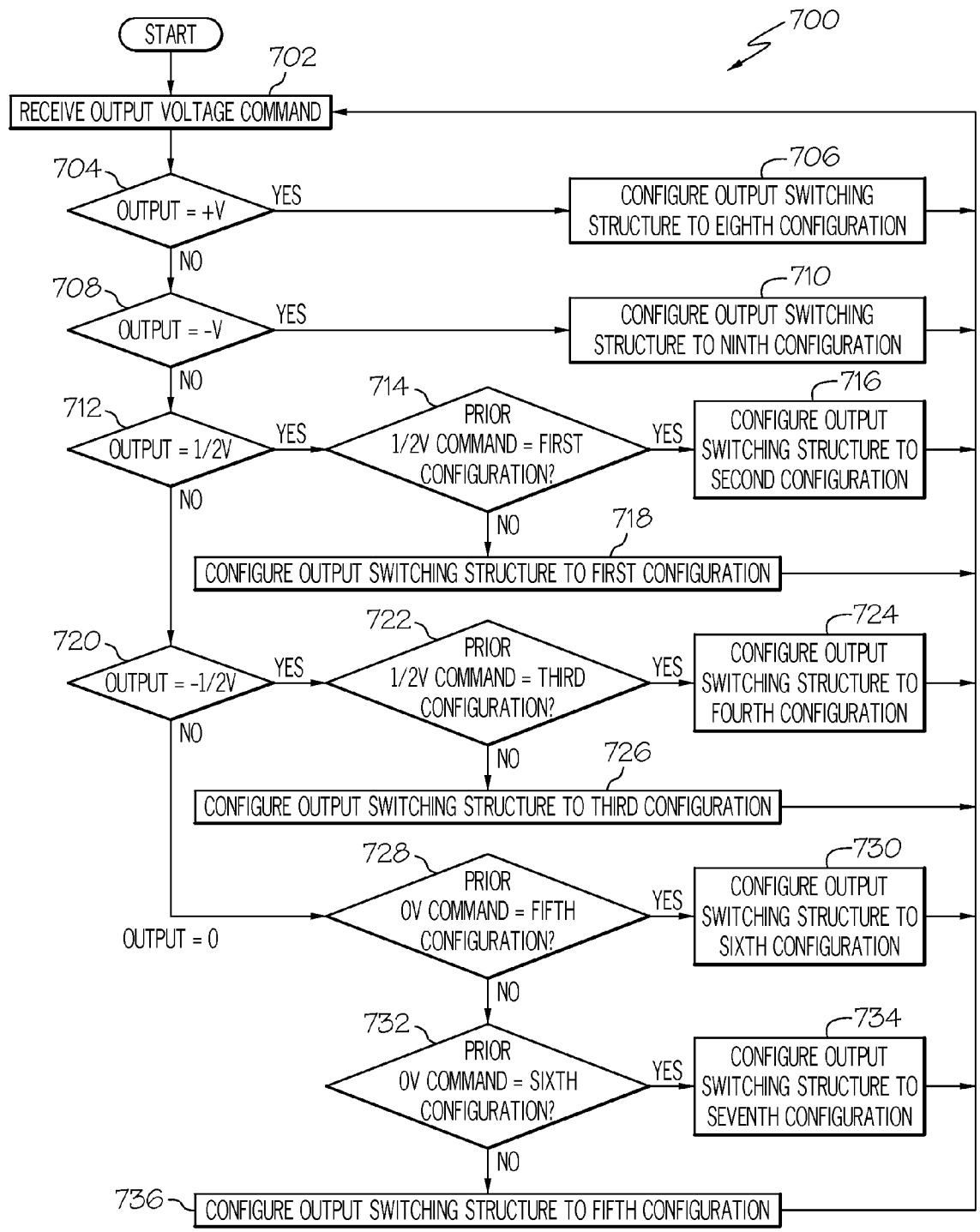
FIG. 7 illustrates a reactive voltage divider charge balancing process, according to one example.

FIG. 7 illustrates a reactive voltage divider charge balancing process 700, according to one example. The reactive voltage divider charge balancing process 700 is an example of processing performed when operating the above described switching mode amplifier output driver 300 in order to maintain a balance of electrostatic charges on the reactive voltage divider formed by the first capacitor 310 and the second capacitor 312. The reactive voltage divider charge balancing process 700 described below describes configuration of an output switching structure that corresponds to the switching structure depicted in the switching mode amplifier output driver 300 that consists of the first switch S1 316 and the second switch S2 318. The following description further refers to switching configurations described above with regards to the switch configuration table 400 as illustrated in FIG. 4.

The operation of the reactive voltage divider charge balancing process 700 further operates to reduce the distortion that may be induced by variations in the actual values of the two capacitors, e.g., the first capacitor 310 and the second capacitor 312 in the above example, that make up the voltage divider to produce the voltage on the center line 308. In on example, the center line 308 has a voltage that is one half of the voltage across the +V line 304 and the −V line 306 and the first capacitor 310 is specified to have a capacitance value equal to the capacitance value of the second capacitor 312. In actual devices, however, the values of these two capacitors will differ by, for example, the manufacturing tolerances of the capacitors and by further aging or degradation of those components that may occur due to various reasons. Differences in the values of the capacitance values of the first capacitor 310 and the second capacitor 312 result in the voltage present on the center line 308 differing from its specified value. The voltage difference between the specified voltage of the center line 308 and the actual voltage is proportional to the difference in the actual capacitance values of the first capacitor 310 and the second capacitor 312.

In an illustration of the difference in voltage between the specified, or design, voltage of the center line 308 and the actual voltage on the center line 308, the first capacitor 310 and the second capacitor 312 are specified to have the same capacitance value, but the actual first capacitor 310 has a capacitance value that is less than the capacitance value of the second capacitor 312. This difference in capacitance values causes the voltage on the center line 308 to be higher than the specified value. As described above, the switching configurations for the first switch 316 and the second switch 318 allow the +½ V to be placed across the load 340 with two possible configurations: 1) by the first configuration that places the load 340 between the +V line 304 and the center line 308, or 2) by the second configuration that places the load 340 between the center line 308 and the −V line 806. In the first configuration, the higher voltage of the center line 308 caused by the unequal values of the first capacitor 310 and the second capacitor 312 cause the voltage across the load 340 to be less than the specified +½ V, and in the second configuration, the voltage across the load 340 is greater than the specified +½ V.

By alternating the switch configurations that connect the ports of the load 340 to the center line, the variations in voltages across the load when placing +½ V across the load will cancel out over time. Stated differently, When C1>C2, the center line has a voltage of +½ V+x, which corresponds to the voltage across the load in the second configuration. The first configuration therefore produces a voltage across the load 340 of +½ V−x. By alternating between +½ V+x and +½ V−x, averaged output voltage, as performed by the low pass filtering of the load 340 in this example, creates an output with reduced distortion caused by component value differences between the first capacitor 310 and the second capacitor 312 relative to their specified values. Similar distortion removal is performed by the reactive voltage divider charge balancing process 700 when placing −½ V across the load 340.

Referring to the above description of the audio amplifier sub-system 200 and multiple level PWM modulator design 600, the reactive voltage divider charge balancing process 700 is at least partially performed in one example by components of the PWM modulator 210, such as the components of the PWM modulator 602. The PWM modulator 210 and PWM modulator 602 are examples of a controller that perform processing to produce indications of the voltage to provide across the load Z 220 and further include components to receive those indications and configure the output driver 214 to provide those voltages.

The reactive voltage divider charge balancing process 700 begins by receiving, at 702, an output voltage command. In the example described for the switching mode amplifier output driver 300, the output voltage command is able to specify one of five possible values, +V, +½V, 0V, −½V, and −V. In further examples, other voltage dividing structures are able to be constructed and different possible output voltage commands are possible.

After receiving the output voltage command, the reactive voltage divider charge balancing process 700 determines, at 704, if the output voltage command is +V. In the event that the command is to set the output voltage to +V, the reactive voltage divider charge balancing process 700 continues by the configuring, at 706, the output switching structure to the eighth configuration, as is described above with regards to FIG. 4. The process then returns to receive, at 702, the next output voltage command.

If the output voltage command was not +V, the reactive voltage divider charge balancing process 700 determines, at 708, if the output voltage command is −V. In the event that the command is to set the output voltage to −V, the reactive voltage divider charge balancing process 700 continues by the configuring, at 710, the output switching structure to the ninth configuration, as is described above with regards to FIG. 4. The process then returns to receive, at 702, the next output voltage command.

If the output voltage command was not −V, the reactive voltage divider charge balancing process 700 determines, at 712, if the output voltage command is +½V. If the output voltage command is +½V, the process determines, at 714, if the prior command to set the output to +½V was to configure the switching structure to the first configuration. If the prior +½V command was to configure the switching structure to the first configuration, the process configures, at 716, the switching structure to the second configuration. If the prior +½V command was not to configure the switching structure to the first configuration, the process continues by configuring, at 718, the output switching structure to the first configuration. The process then returns to receive, at 702, the next output voltage command. Stated differently, the processing performed in response to an output voltage command that is an indication to provide a fraction of the supply voltage, such as +½ V, across the load responds to a first indication to provide the fraction of the supply voltage by configuring the switching structure to the first configuration, and responds to a subsequent indication to provide the fraction of the supply voltage by configuring the switching structure to the second configuration.

If the output voltage command was not +½V, the reactive voltage divider charge balancing process 700 determines, at 720, if the output voltage command is −½V. If the output voltage command is −½V, the process determines, at 722, if the prior command to set the output to −½V was to configure the switching structure to the third configuration. If the prior −½V command was to configure the switching structure to the third configuration, the process configures, at 724, the switching structure to the fourth configuration. If the prior −½V command was not to configure the switching structure to the third configuration, the process continues by configuring, at 726, the output switching structure to the third configuration. The process then returns to receive, at 702, the next output voltage command. Stated differently, the processing performed in response to an output voltage command that is an indication to provide a fraction of the supply voltage with an opposite polarity, such as −½ V, across the load responds to a first indication to provide the fraction of the supply voltage with the opposite polarity by configuring the switching structure to the third configuration, and responds to a subsequent indication to provide the fraction of the supply voltage by configuring the switching structure to the fourth configuration.

If the output voltage command was not −½V, the voltage command is assumed to be to set the output voltage to zero (0) volts because that is the only remaining valid output voltage level. If the output voltage command is 0 V, the process determines, at 728, if the prior command to set the output to 0V was to configure the switching structure to the fifth configuration. If the prior 0V command was to configure the switching structure to the fifth configuration, the process configures, at 730, the switching structure to the sixth configuration. If the prior 0V command was not to configure the switching structure to the fifth configuration, the process determines, at 732, if the prior command to set the output to 0V was to configure the switching structure to the sixth configuration. If the prior 0V command was to configure the switching structure to the sixth configuration, the process configures, at 734, the switching structure to the fourth configuration. If the prior 0V command was not to configure the switching structure to the sixth configuration, the process continues by configuring, at 736, the output switching structure to the fifth configuration. The process then returns to receive, at 702, the next output voltage command.

The reactive voltage divider charge balancing process 700 in one example operates to alternate the configuration of the switching structure that is used when receiving a sequence of commands that specify the same output voltage. As described above, a sequence of commands to set the output voltage to zero causes the switching structure to be configured into the fifth configuration when the first command of the sequence is received, configured into the sixth configuration when the second command of the sequence is received, and configured into the fourth configuration when the third command of the sequence is received. This sequence of configurations is then repeated as further commands to set the output voltage to zero are received. As used herein, a number of commands, or of other indications, to set the output voltage to a particular voltage level occur in a sequence by temporally occurring one after another. These commands or other indications to set the output voltage to a particular voltage are able to occur immediately after one another, or are able to be separated by one or more commands or other indications to set the output voltage to other voltages. A each command to set the output voltage to a particular voltage level that occur in a sequence are able to be separated by one command or indication to set the output voltage level to another voltage level, or they are able to be separated by multiple commands or indications to set the output voltage level to other voltage levels, where these multiple commands are able to indicate the same other voltage level or different other voltage levels.

Figure 8:
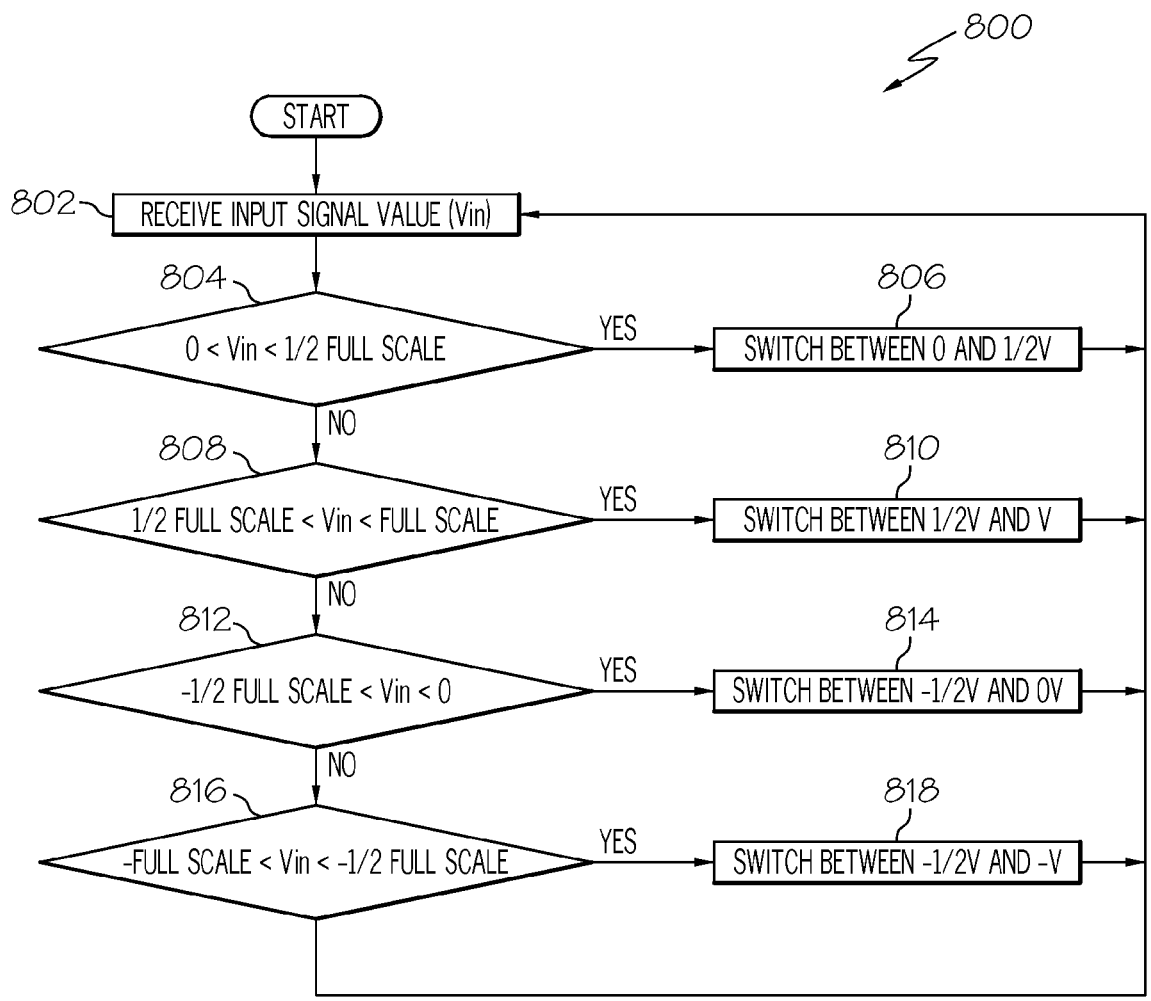
FIG. 8 illustrates a least magnitude output switching process, according to one example.

FIG. 8 illustrates a least magnitude output switching process 800, according to one example. The least magnitude output switching process 800 is performed by a PWM modulator 214 in one example to command the output driver 214 to operate as a switching mode amplifier in a manner such that changes in output voltages in response to switching voltage levels result in a minimum voltage change at each switching interval. Such operations result in reducing spurious signals produced by the switching operations of the output driver and further improve the performance of the switching mode amplifier.

With reference to FIG. 2 as described above, the following discussion to an "input signal (Vin)" that is generally between a "+full scale" value and a "−full scale" value. As is common with audio amplifiers, an input voltage range, or digital value range in the instance of a digital input signal interface, is often specified for the amplifier's input and normal amplifier operations assume that the input voltage is within this input voltage range. In the following discussion, this input voltage range is referred to as being between a −full scale value and a full scale value. In the following discussion, the operation of the output driver is described as switching between two voltages. As described above, the switching of the output driver voltage between two voltages is performed with a duty cycle dependent upon the value of the input signal Vin in order to replicate the waveform of the input signal at the output of the output driver when that output is low pass filtered.

The least magnitude output switching process 800 begins by receiving, at 802, an input signal indicated as "Vin." In the example depicted in FIG. 3, Vin is able to be received through the analog interface 204 or the digital interface 208. As is also described above, in one example the received input signal is compared to saw tooth or triangular waveforms to determine when to switch the output driver between two voltages such that their low frequency components (which roughly correspond to a short term average value) replicate the input waveform.

After receiving the input signal Vin, the least magnitude output switching process 800 determines, at 804, if the value of the input signal is between 0 and +½ full scale. If the input signal is between 0 and +½ full scale, the least magnitude output switching process 800 operates the output driver 214 to switch, at 806, the output voltage on the output 218 that is provided to the load Z 220 between 0 and ½V. The process then returns to receive, at 802, the next input signal value (Vin).

If the value of the input signal is not between 0 and +½ full scale, the process determines, at 808, if the input signal is between +½ full scale and full scale. If the input signal is between +½ full scale and full scale, the least magnitude output switching process 800 operates the output driver 214 to switch, at 810, the output voltage to the load Z 220 between ½V and V. The process then returns to receive, at 802, the next input signal value (Vin).

If the value of the input signal is not between ½ full scale and +full scale, the process determines, at 812, if the input signal is between −½ full scale and zero (0). If the input signal is between −½ full scale and zero, the least magnitude output switching process 800 operates the output driver 214 to switch, at 814, the output voltage to the load Z 220 between −½V and 0V. The process then returns to receive, at 802, the next input signal value (Vin).

If the value of the input signal is not between −½ full scale and zero, the process determines, at 86, if the input signal is between −full scale and −½ full scale. If the input signal is between −full scale and −½ full scale, the least magnitude output switching process 800 operates the output driver 214 to switch, at 818, the output voltage to the load Z 220 between −½V and −V. The process then returns to receive, at 802, the next input signal value (Vin).

Figure 9:
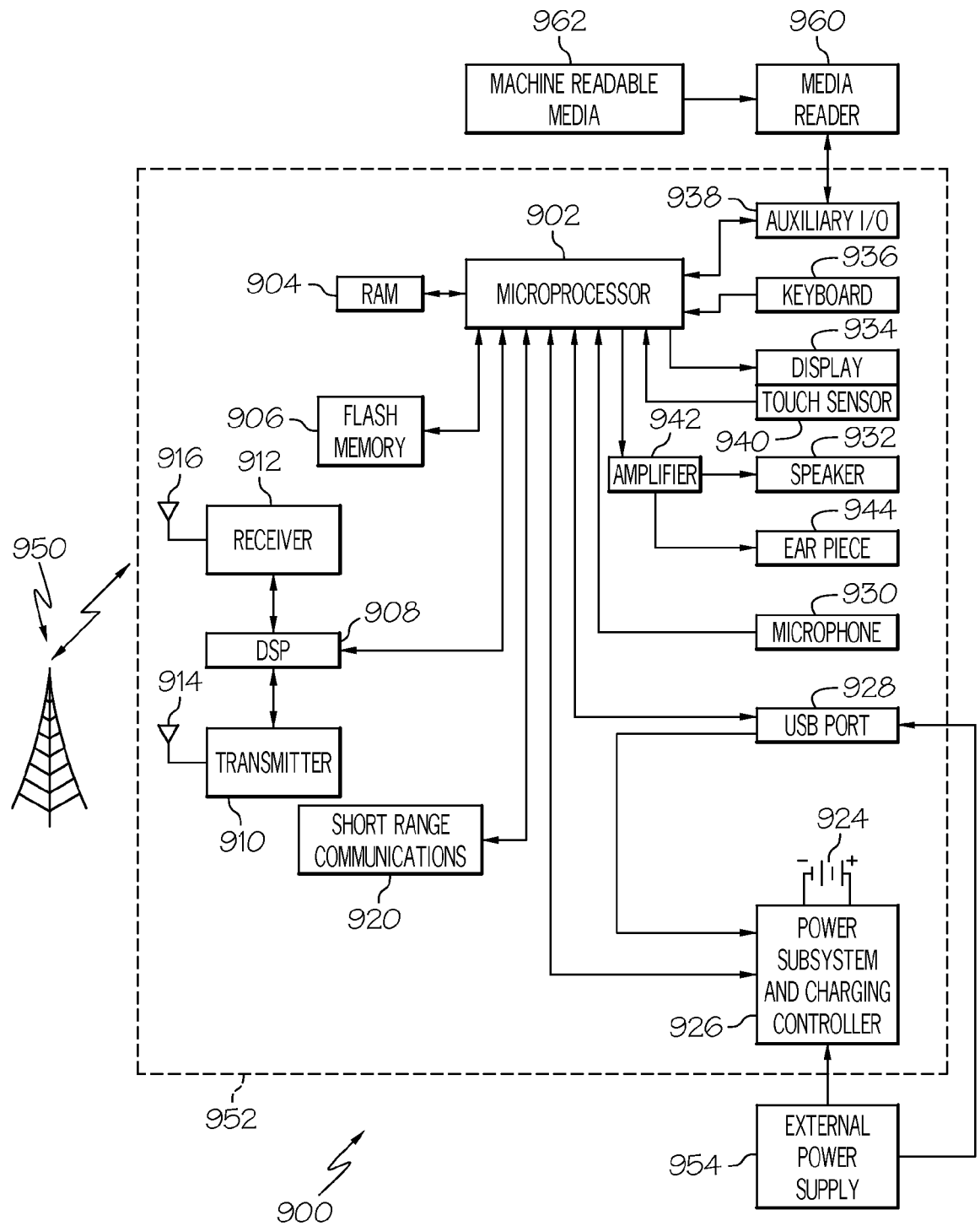
FIG. 9 is a block diagram of an electronic device and associated components.

FIG. 9 is a block diagram of an electronic device and associated components 900 that is able to include the above described systems and perform the above described methods. In this example, an electronic device 952 is a wireless two-way communication device with voice and data communication capabilities. Such electronic devices communicate with a wireless network 950, which is able to include a wireless voice network, a wireless data network, or both, that use one or more wireless communications protocols. Wireless voice communications are performed using either an analog or digital wireless communication channel. Data communications allow the electronic device 952 to communicate with other computer systems via the Internet. Examples of electronic devices that are able to incorporate the above described systems and methods include, for example, a data messaging device, a two-way pager, a cellular telephone with data messaging capabilities, a wireless Internet appliance or a data communication device that may or may not include telephony capabilities.

The illustrated electronic device 952 is an example electronic device that includes two-way wireless communications functions. Such electronic devices incorporate a wireless communication component that includes a wireless communications subsystem including elements such as a wireless transmitter 910, a wireless receiver 912, and associated components such as one or more antenna elements 914 and 916. A digital signal processor (DSP) 908 performs processing to extract data from received wireless signals and to generate signals to be transmitted. The particular design of the communication subsystem is dependent upon the wireless communications network and associated wireless communications protocols with which the device is intended to operate.

The electronic device 952 includes a microprocessor 902 that controls the overall operation of the electronic device 952. The microprocessor 902 interacts with the above described communications subsystem elements and also interacts with other device subsystems such as flash memory 906, random access memory (RAM) 904, auxiliary input/output (I/O) device 938, USB Port 928, display 934, touch sensor 940, keyboard 936, speaker 932, audio amplifier 942, earpiece 944, a short-range communications subsystem 920, an orientation sensor 954, a handedness indicator 948, a power subsystem and charging controller 926, and any other device subsystems.

The electronic device 952 in one example includes a microphone 930, which is similar to the above described microphone 106, that picks up ambient sounds including a user's spoken words. Sounds picked up by the microphone 930 are provided to the microprocessor 902 in one example. The microprocessor 902 in that example conditions and processes such audio signals in order to, for example, broadcast the audio over the above described two-way wireless communications functions. The electronic device 952 also includes an audio amplifier 942 that receives audio signals, such as from the microprocessor 902, and amplifies those signals for reproduction by one or both of the speaker 932 and earpiece 944. In one example, the speaker 932 is similar to the above described loudspeaker 104 and the earpiece 944 is similar to the above described earpiece speaker 112.

The display 934 in one example is able to be a touch screen display such as is discussed above. In this example, the display 934 has an attached touch sensor 940. In the case of a touch screen display, the display 934 and the touch sensor 940 provide user input information to microprocessor 902 in addition to presenting information provided by microprocessor 902. In the case of a touch screen display with touch sensor 940 that is used in conjunction with the display 934, the keyboard 936 may not be included in the electronic device 952 or the keyboard 936 may include a reduced number of keys.

A power pack 924 is connected to a power subsystem and charging controller 926. The power pack 924 provides power to the circuits of the electronic device 952. The power subsystem and charging controller 926 includes power distribution circuitry for providing power to the electronic device 952 and also contains power pack charging controller circuitry to manage recharging the power pack 924.

The USB port 928 provides data communication between the electronic device 952 and one or more external devices. Data communication through USB port 928 enables a user to set preferences through the external device or through a software application and extends the capabilities of the device by enabling information or software exchange through direct connections between the electronic device 952 and external data sources rather than through a wireless data communication network.

Operating system software used by the microprocessor 902 is stored in flash memory 906. Further examples are able to use a power pack backed-up RAM or other non-volatile storage data elements to store operating systems, other executable programs, or both. The operating system software, device application software, or parts thereof, are able to be temporarily loaded into volatile data storage such as RAM 904. Data received via wireless communication signals or through wired communications are also able to be stored to RAM 904.

The microprocessor 902, in addition to its operating system functions, is able to execute software applications on the electronic device 952. A predetermined set of applications that control basic device operations, including at least data and voice communication applications, is able to be installed on the electronic device 952 during manufacture. Examples of applications that are able to be loaded onto the device may be a personal information manager (PIM) application having the ability to organize and manage data items relating to the device user, such as, but not limited to, e-mail, calendar events, voice mails, appointments, and task items.

Further applications may also be loaded onto the electronic device 952 through, for example, the wireless network 950, an auxiliary I/O device 938, USB port 928, short-range communications subsystem 920, or any combination of these interfaces. Such applications are then able to be installed by a user in the RAM 904 or a non-volatile store for execution by the microprocessor 902.

In a data communication mode, a received signal such as a text message or web page download is processed by the communication subsystem, including wireless receiver 912 and wireless transmitter 910, and communicated data is provided the microprocessor 902, which is able to further process the received data for output to the display 934, or alternatively, to an auxiliary I/O device 938 or the USB port 928. A user of the electronic device 952 may also compose data items, such as e-mail messages, using the keyboard 936, which is able to include a complete alphanumeric keyboard or a telephone-type keypad, in conjunction with the display 934 and possibly an auxiliary I/O device 938. Such composed items are then able to be transmitted over a communication network through the communication subsystem.

For voice communications, overall operation of the electronic device 952 is substantially similar, except that received signals are generally reproduced by the speaker 932 or earpiece 944, and signals for transmission are generally produced by a microphone, such as microphone 930. Alternative voice or audio I/O subsystems, such as a voice message recording subsystem, may also be implemented on the electronic device 952. Although voice or audio signal output is generally accomplished primarily through the speaker 932, the display 934 may also be used to provide an indication of the identity of a calling party, the duration of a voice call, or other voice call related information, for example.

Depending on conditions or statuses of the electronic device 952, one or more particular functions associated with a subsystem circuit may be disabled, or an entire subsystem circuit may be disabled. For example, if the power pack temperature is high, then voice functions may be disabled, but data communications, such as e-mail, may still be enabled over the communication subsystem.

A short-range communications subsystem 920 is a further optional component which may provide for communication between the electronic device 952 and different systems or devices, which need not necessarily be similar devices. For example, the short-range communications subsystem 920 may include an infrared device and associated circuits and components or a Radio Frequency based communication module such as one supporting Bluetooth® communications, to provide for communication with similarly-enabled systems and devices.

A media reader 960 is able to be connected to an auxiliary I/O device 938 to allow, for example, loading computer readable program code of a computer program product into the electronic device 952 for storage into flash memory 906. One example of a media reader 960 is an optical drive such as a CD/DVD drive, which may be used to store data to and read data from a computer readable medium or storage product such as computer readable storage media 962. Examples of suitable computer readable storage media include optical storage media such as a CD or DVD, magnetic media, or any other suitable data storage device. Media reader 960 is alternatively able to be connected to the electronic device through the USB port 928 or computer readable program code is alternatively able to be provided to the electronic device 952 through the wireless network 950.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

Non-Limiting Examples

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A switching mode amplifier, comprising:
  a power supply input receiving a supply voltage across a first input and a second input;
  a first capacitor having a respective first terminal fixedly coupled to the first input and a respective second terminal fixedly coupled to a center line;
  a second capacitor having a respective first terminal fixedly coupled to the center line and a respective second terminal fixedly coupled to the second input;

a switching structure configurable to:
   selectably couple a first port to one of the first input, the second input, and the center line; and
   selectably couple a second port to one of the first input, the second input, and the center line; and
a controller configured to alternate a direction of electrical current flow through the first capacitor and the second capacitor, the controller configured to:
   configure, in response to a first indication to provide a fraction of the supply voltage across the first port and the second port, the switching structure into a first configuration, the first configuration coupling the first port to the first input and coupling the second port to the center line; and
   configure, in response to a subsequent indication to provide the fraction of the supply voltage across the first port and the second port, the switching structure into a second configuration, the second configuration coupling the first port to the center line and coupling the second port to the second input, wherein the subsequent indication occurs after the first indication.

2. The switching mode amplifier of claim 1, wherein the controller is further configured to alternate configuring the switching structure into the first configuration and into the second configuration in response to receiving each indication to provide the fraction of the supply voltage across the first port and the second port.

3. The switching mode amplifier of claim 1, wherein the first capacitor has a first value and the second capacitor has a second value, wherein the first value is substantially equal to the first value.

4. The switching mode amplifier of claim 1, wherein the controller is further configured to:
   configure, in response to a first indication to provide the fraction of the supply voltage across the first port and the second port with an opposite polarity, the switching structure into a third configuration, the third configuration coupling the first port to the second input and coupling the second port to the center line; and
   configuring, in response to a second indication to provide the fraction of the supply voltage across the first port and the second port with the opposite polarity, the switching structure into a fourth configuration, the fourth configuration coupling the first port to the center line and coupling the second port to the second input, wherein the second indication to provide the fraction of the supply voltage across the first port and the second port with an opposite polarity occurs subsequent to the first indication to provide the fraction of the supply voltage across the first port and the second port with an opposite polarity.

5. The switching mode amplifier of claim 4, wherein the controller is further configured to alternate configuring the switching structure into the third configuration and into the fourth configuration in response to receiving each indication to provide the fraction of the supply voltage with the opposite polarity across the first port and the second port.

6. The switching mode amplifier of claim 1, wherein the controller is further configured to:
   configure, in response to a first indication to provide zero voltage across the first port and the second port, the switching structure into a fifth configuration, the fifth configuration coupling the first port to the first input and coupling the second port to the first input;
   configure, in response to a second indication to provide a zero voltage across the first port and the second port, the switching structure into a sixth configuration, the sixth configuration coupling the first port to the center line and coupling the second port to the center line; and
   configure, in response to a third indication to provide zero voltage across the first port and the second port, the switching structure into a seventh configuration, the seventh configuration coupling the first port to the second input and coupling the second port to the second input, wherein the first indication to provide a zero voltage, the second indication to provide a zero voltage, and the third indication to provide a zero voltage occur in a sequence.

7. A method for operating a switched mode amplifier, the method comprising:
   configuring, in response to a first indication to provide a fraction of a supply voltage across a first port and a second port, a switching structure into a first configuration, wherein the switching structure selectably couples the first port to one of a first input, a second input, and a center line; and selectably couples the second port to one of the first input, the second input, and the center line, wherein the first input and the second input receive the supply voltage, wherein:
      a first capacitor having a respective first terminal is fixedly coupled to the first input and a respective second terminal fixedly coupled to a center line, and
      a second capacitor having a respective first terminal fixedly coupled to the center line and a respective second terminal fixedly coupled to the second input, and
   wherein the first configuration couples the first port to the first input and couples the second port to the center line; and
   configuring, in response to a subsequent indication to provide the fraction of the supply voltage across the first port and the second port, the switching structure into a second configuration, the second configuration coupling the first port to the center line and coupling the second port to the second input, wherein the subsequent indication occurs after the first indication; and
   alternating a direction of electrical current flow through the first capacitor and the second capacitor by alternating, in response to receiving each indication within a sequence of indications to provide the fraction of the supply voltage across the first port and the second port, configuring the switching structure into the first configuration and the second configuration.

8. The method of claim 7, wherein the first capacitor has a first value and the second capacitor has a second value, wherein the first value is substantially equal to the first value.

9. The method of claim 7, further comprising alternating configuring the switching structure into the first configuration and into the second configuration in response to receiving each indication to provide the fraction of the supply voltage across the first port and the second port.

10. The method of claim 7, further comprising:
   configuring in response to a first indication to provide the fraction of the supply voltage across the first port and the second port with an opposite polarity, the switching structure into a third configuration, the third configuration comprising configuring the first switching structure to connect the first port to the second input and configure the second switching structure to connect the second port to the center line; and
   configuring in response to a second indication to provide the fraction of the supply voltage across the first port and the second port, the switching structure into a fourth configuration, the fourth configuration coupling the first port to the center line and coupling the second port to the second input, wherein the second indication occurs subsequent to the first indication.

11. The method of claim 10, further comprising alternating configuring the switching structure into the third configuration and into the fourth configuration in response to receiving each indication to provide the fraction of the supply voltage with the opposite polarity across the first port and the second port.

12. The method of claim 7, further comprising:
configuring, in response to a first indication to provide zero voltage across the first port and the second port, the switching structure into a fifth configuration, the fifth configuration coupling the first port to the first input and coupling the second port to the first input;
configuring, in response to a second indication to provide a zero voltage across the first port and the second port, the switching structure into a sixth configuration, the sixth configuration coupling the first port to the center line and coupling the second port to the center line; and
configuring, in response to a third indication to provide zero voltage across the first port and the second port, the switching structure into a seventh configuration, the seventh configuration coupling the first port to the second input and coupling the second port to the second input,
wherein the first indication to provide a zero voltage, the second indication to provide a zero voltage, and the third indication to provide a zero voltage occur in a sequence.

13. An audio amplification device, comprising:
a body;
an audio input configured to receive an audio signal;
a processor contained within the body;
a memory, communicatively coupled to the processor, configured to store information operated upon by the processor;
a power supply input receiving a supply voltage across a first input and a second input;
a first capacitor having a respective first terminal fixedly coupled to the first input and a respective second terminal fixedly coupled to a center line;
a second capacitor having a respective first terminal fixedly coupled to the center line and a respective second terminal fixedly coupled to the second input;
a switching structure configurable to:
selectably couple a first port to one of the first input, the second input, and the center line; and
selectably couple a second port to one of the first input, the second input, and the center line;
a pulse width modulation modulator configured to generate, based on the audio signal, at least an indication to provide a fraction of the supply voltage across the first port and the second port, an indication to provide the supply voltage across the first port and the second port, and an indication to provide zero voltage across the first port and the second port; and
a controller configured to alternate a direction of electrical current flow through the first capacitor and the second capacitor, the controller configured to:
configure, in response to a first indication to provide the fraction of the supply voltage across the first port and the second port, the switching structure into a first configuration, the first configuration coupling the first port to the first input and coupling the second port to the center line; and
configure, in response to a subsequent indication to provide the fraction of the supply voltage across the first port and the second port, the switching structure into a second configuration, the second configuration coupling the first port to the center line and coupling the second port to the second input, wherein the subsequent indication occurs after the first indication.

14. The audio amplification device of claim 13, further comprising an audio transducer electrically coupled to the first port and the second port.

15. A wireless communications device, comprising:
a housing;
a wireless receiver, coupled to the housing, configured to produce an audio signal;
a processor;
a memory, communicatively coupled to the processor, configured to store information operated upon by the processor;
a power supply input receiving a supply voltage across a first input and a second input;
a first capacitor having a respective first terminal fixedly coupled to the first input and a respective second terminal fixedly coupled to a center line;
a second capacitor having a respective first terminal fixedly coupled to the center line and a respective second terminal fixedly coupled to the second input;
a switching structure configurable to:
selectably couple a first port to one of the first input, the second input, and the center line; and
selectably couple a second port to one of the first input, the second input, and the center line;
a pulse width modulation modulator configured to generate, based on the audio signal, at least an indication to provide a fraction of the supply voltage across the first port and the second port, an indication to provide the supply voltage across the first port and the second port, and an indication to provide zero voltage across the first port and the second port; and
a controller configured to alternate a direction of electrical current flow through the first capacitor and the second capacitor, the controller configured to:
configure, in response to a first indication to provide the fraction of the supply voltage across the first port and the second port, the switching structure into a first configuration, the first configuration coupling the first port to the first input and coupling the second port to the center line; and
configure, in response to a subsequent indication to provide the fraction of the supply voltage across the first port and the second port, the switching structure into a second configuration, the second configuration coupling the first port to the center line and coupling the second port to the second input, wherein the subsequent indication occurs after the first indication.

* * * * *